United States Patent
Jamshidi Roudbari et al.

(10) Patent No.: US 10,078,405 B2
(45) Date of Patent: Sep. 18, 2018

(54) DISPLAYS WITH GATE DRIVER CIRCUITRY FOR DISCHARGING DISPLAY PIXELS

(71) Applicant: Apple Inc., Cupertino, CA (US)

(72) Inventors: Abbas Jamshidi Roudbari, Sunnyvale, CA (US); Keitaro Yamashita, Nishinomiya (JP)

(73) Assignee: Apple Inc., Cupertino, CA (US)

( * ) Notice: Subject to any disclaimer, the term of this patent is extended or adjusted under 35 U.S.C. 154(b) by 250 days.

(21) Appl. No.: 14/988,586

(22) Filed: Jan. 5, 2016

(65) Prior Publication Data
US 2017/0031477 A1 Feb. 2, 2017

Related U.S. Application Data

(60) Provisional application No. 62/198,074, filed on Jul. 28, 2015.

(51) Int. Cl.
*G06F 3/044* (2006.01)
(52) U.S. Cl.
CPC .................................. *G06F 3/044* (2013.01)
(58) Field of Classification Search
CPC ... G09G 2310/0264; G09G 2310/0286; G09G 3/36
See application file for complete search history.

(56) References Cited

U.S. PATENT DOCUMENTS

| | | | |
|---|---|---|---|
| 7,268,762 B2 | 9/2007 | Kitagawa et al. | |
| 8,614,701 B2 | 12/2013 | Watanabe | |
| 2004/0257322 A1* | 12/2004 | Moon | G09G 3/3648 345/87 |
| 2005/0285840 A1* | 12/2005 | Jang | G09G 3/3677 345/100 |
| 2009/0261878 A1* | 10/2009 | Lin | H03K 5/13 327/261 |
| 2015/0356934 A1 | 12/2015 | Yamashita et al. | |

FOREIGN PATENT DOCUMENTS

JP 2010164953 A 7/2010
JP 2011170349 A 9/2011

* cited by examiner

*Primary Examiner* — Latanya Bibbins
(74) *Attorney, Agent, or Firm* — Treyz Law Group, P.C.; Tianyi He; Michael H. Lyons (57) ABSTRACT

A touch screen display may include gate line driver circuitry coupled to a display pixel array. The gate driver circuitry may include gate drivers connected in a chain. A given one of the gate drivers may include a set-reset latch. The set-reset latch may have a set input and a reset input. A logic gating circuit such as a logic NOR gate may have an output directly connected to the set input. The NOR gate may have a first input coupled to an output of a preceding gate driver in the chain and a second input coupled to an output of a succeeding gate driver. The reset input may be coupled to the output of the preceding gate driver. Gate line output signals may be simultaneously asserted for each of the drivers without generating unstable scenarios where logic high signals are provided to the set and reset inputs.

21 Claims, 11 Drawing Sheets

DISPLAYS WITH GATE DRIVER CIRCUITRY FOR DISCHARGING DISPLAY PIXELS

This application claims the benefit of provisional patent application No. 62/198,074, filed on Jul. 28, 2015, which is hereby incorporated by reference herein in its entirety.

BACKGROUND

This relates generally to electronic devices, and more particularly, to electronic devices with touch screen displays.

Touch screen displays are prevalent in many applications, including consumer electronics devices such as smartphones, tablet devices, and laptop and desktop computers. The display function in such devices is typically performed by a liquid crystal display (LCD), plasma, or organic light emitting diode (OLED) display element array that is connected to a grid of source (data) and gate (select) metal traces. The display element array is often formed on a transparent panel such as a glass panel, which serves as a protective shield. The data and select lines of the display element array may be driven by a display driver integrated circuit (IC). The driver IC receives an image or video signal, which it then decodes into raster scan pixel values (color or gray scale) and writes them to the display element array during each frame, by driving the data and select lines. This process is repeated at a high enough frame rate so as to render video.

The touch gesture detection function in such devices is typically performed using a capacitance sensing subsystem in which a touch transducer grid structure overlays the display element array. The touch transducer structure is stimulated and sensed by touch controller circuitry. A touch stimulus signal is applied to the row segments of the grid, while simultaneously sensing the column segments (to detect a single-touch or a multi-touch gesture). Touch detection is typically performed during a blanking interval portion of the frame, while the display function is performed during a display interval portion of the frame.

The touch transducer grid structure can be implemented as a light transparent electrode plate that covers the display element array and may be formed on a rear surface of the protective panel. In some cases, the transparent electrode plate is also connected to the display elements, serving to deliver a "common voltage" to the display elements from a voltage source circuit often referred to as a Vcom conditioning circuit. The Vcom conditioning circuit helps improve the display function by adjusting a voltage on the transparent conductor plate that changes the light modulation characteristics of the connected display elements (during the display interval). As such, the transparent electrode plate is dual purposed in that it is used for both the display function and as the touch transducer grid structure.

As such, the touch screen display alternates between the display interval during which the display element array is activated and the blanking (or touch) interval during which the touch gesture detection function is activated. During each display interval, an entire frame is loaded into the display element array. The touch interval is typically positioned between successive display intervals (i.e., each touch interval occurs only after an entire frame has been scanned in). It is within this context that the embodiments described herein arise.

SUMMARY

An electronic device having a liquid crystal display (LCD) is provided. The liquid crystal display may include display pixel circuitry formed on a glass substrate. Thin-film transistor structures may be formed on the glass substrate.

The display pixel circuitry may include a display pixel array and gate driver circuitry coupled to the array. The gate driver circuitry may include multiple gate drivers connected in a chain. In accordance with an embodiment, a given one of the gate drivers may include a set-reset latching circuit. The set-reset latching circuit may generate a latch output signal and may have a set input and a reset input. The gate driver may include a logic gating circuit such as a logic NOR gate having an output that is directly connected to the set input. The logic NOR gate may have a first input that is coupled to a first output of a preceding gate driver in the chain. The logic NOR gate may have a second input that is coupled to a second output of a succeeding gate driver in the chain.

The first input of the logic NOR gate may receive a first gate driver output signal from the first output of the preceding gate driver. An inverter may have an inverter output coupled to the second input of the logic NOR gate. An input of the inverter may be coupled to the second output of the succeeding gate driver and may receive a second gate driver output signal from the succeeding gate driver. The reset input of the set-reset latching circuit may receive the first gate driver output signal from the first output of the preceding gate driver. The set-reset latching circuit may include a control terminal that receives a reset control signal that resets the given gate driver. A pass transistor may pass a clock signal to the output terminal based at least partly on the latch output signal. The clock signal may drive display pixels in a given row of the display pixel array.

The gate driver circuitry may include gate driver control circuitry. The gate driver control circuitry may be configured to operate the gate drivers in a gate-all-select mode while the display is in a power down mode by simultaneously asserting first and second clock signals and a gate start pulse signal provided to the gate drivers. The gate driver control circuitry may be configured to perform slew rate control operations on the gate driver circuitry. The first gate driver output signal and the second gate driver output signals may be simultaneously asserted at a logic high level in the gate-all-select mode. The gate driver circuitry may be operable in the gate-all-select mode to discharge the display pixels during power-down without generating unstable scenarios in which logic high signals are provided to both the set and reset inputs of the set-reset latching circuitry.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

DETAILED DESCRIPTION

Displays are widely used in electronic devices. For example, displays may be used in computer monitors, laptop computers, media players, cellular telephones and other handheld devices, tablet computers, televisions, and other equipment. Displays may be based on plasma technology, organic-light-emitting-diode technology, liquid crystal structures, etc. Liquid crystal displays are popular because they can exhibit low power consumption and good image quality. Liquid crystal display (LCD) structures are sometimes described herein as an example.

Figure 1:
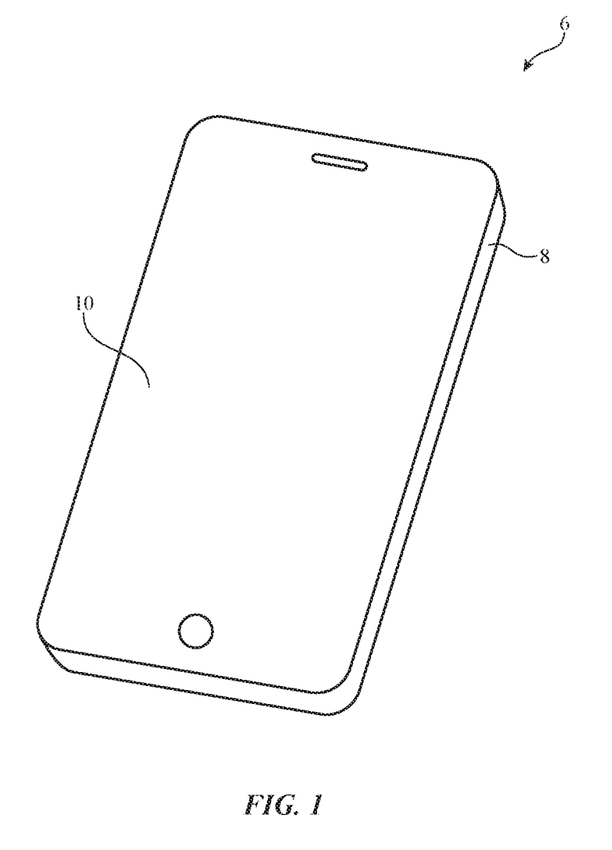
FIG. 1 is a perspective view of an illustrative electronic device having a display such as a liquid crystal display in accordance with an embodiment.

A perspective view of an illustrative electronic device with a display is shown in FIG. 1. As shown in FIG. 1, electronic device 6 may have a housing such as housing 8. Housing 8 may be formed from materials such as plastic, glass, ceramic, metal, fiber composites, and combinations of these materials. Housing 8 may have one or more sections. For example, device 6 may be provided with a display housing portion and a base housing portion that are coupled by hinges. In the arrangement of FIG. 1, device 6 has a front face and a rear face. Display 10 of FIG. 1 is mounted on the front face of housing 8. Other configurations may be used if desired.

The illustrative configuration of device 6 in FIG. 1 is merely illustrative. In general, electronic device 6 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Display 10 may be a liquid crystal display. A touch sensor array may be incorporated into display 10 (e.g., to form a touch screen display). The touch sensor may be based on acoustic touch technology, force sensor technology, resistive sensor technology, or other suitable types of touch sensor. With one suitable arrangement, the touch sensor portion of display 10 may be formed using a capacitive touch sensor arrangement. With this type of configuration, display 10 may include a touch sensor array that is formed from rows and columns of capacitive touch sensor electrodes. In other suitable arrangements, the touch sensor array may be grouped into separate discrete regions.

Figure 2:
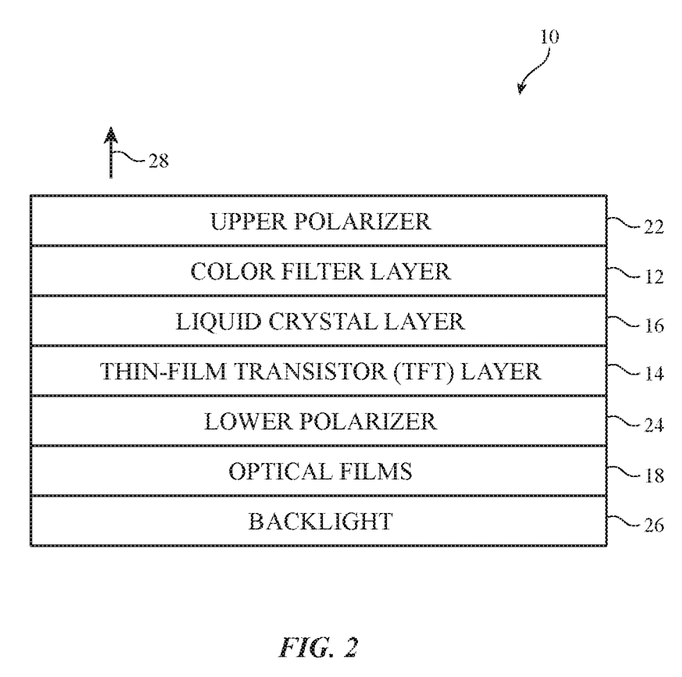
FIG. 2 is cross-sectional side view of an illustrative display in accordance with an embodiment of the present invention.

A cross-sectional side view of a portion of a display of the type that may be used in forming display 10 of FIG. 1 is shown in FIG. 2. As shown in FIG. 2, display 10 may include color filter (CF) layer 12 and thin-film-transistor (TFT) layer 14. Color filter layer 12 may include an array of colored filter elements. In a typical arrangement, the pixels of layer 12 each include three types of colored pixels (e.g., red, green, and blue subpixels). Liquid crystal (LC) layer 16 includes liquid crystal material and is interposed between color filter layer 12 and thin-film-transistor layer 14. Thin-film-transistor layer 14 may include electrical components such as thin film transistors, capacitors, and electrodes for controlling the electric fields that are applied to liquid crystal layer 16. In other suitable arrangements, thin-film transistor layer 14 may be formed on top of the liquid crystal material while the color filter layer 12 may be formed below the liquid crystal material.

Display 10 may have upper and lower polarizer layers 22 and 24. Backlight 26 may provide backside illumination for display 10. Backlight 26 may include a light source such as a strip of light-emitting diodes. Backlight 26 may also include a light-guide plate and a back reflector. The back reflector may be located on the lower surface of the light-guide panel to prevent light leakage. Optical films 18 may be interposed between the lower polarizer 24 and the backlight unit 26. Optical films 18 may include diffuser layers for helping to homogenize the backlight and thereby reduce hotspots, compensation films for enhancing off-axis viewing, and brightness enhancement films (also sometimes referred to as turning films or prism films) for collimating the backlight. Light from the light source may be injected into an edge of the light-guide panel and may scatter upwards in direction 28 through display 10. An optional cover layer such as a layer of coverglass may be used to cover and protect the layers of display 10 that are shown in FIG. 2.

Touch sensor structures may be incorporated into one or more of the layers of display 10 if desired. In a typical touch sensor configuration, an array of capacitive touch sensor electrodes may be implemented using pads and/or strips of a transparent conductive material such as indium tin oxide. Other touch technologies may be used if desired (e.g., resistive touch, acoustic touch, optical touch, etc.). Indium tin oxide or other transparent conductive materials or non-transparent conductors may also be used in forming signal lines in display 10 (e.g., structures for conveying data, power, control signals, etc.).

In black and white displays, color filter layer 12 can be omitted. In color displays, color filter layer 12 can be used to impart colors to an array of image pixels. Each image pixel may, for example, have three corresponding liquid crystal diode subpixels. Each subpixel may be associated with a separate color filter element in the color filter array. The color filter elements may, for example, include red (R) color filter elements, blue (B) color filter elements, and green (G) color filter elements. These elements may be arranged in rows and columns. For example, color filter elements can be arranged in stripes across the width of display 10 (e.g., in a repeating patterns such as a RBG pattern or BRG pattern) so that the color filter elements in each column are the same (i.e., so that each column contains all red elements, all blue elements, or all green elements). By controlling the amount of light transmission through each subpixel, a desired colored image can be displayed.

The amount of light transmitted through each subpixel can be controlled using display control circuitry and electrodes. Each subpixel may, for example, be provided with a transparent indium tin oxide electrode. The signal on the subpixel electrode, which controls the electric field through an associated portion of the liquid crystal layer and thereby controls the light transmission for the subpixel, may be applied using a thin film transistor. The thin film transistor may receive data signals from data lines and, when turned on by an associated gate line, may apply the data line signals to the electrode that is associated with that thin-film transistor. The example in which display 10 is an LCD structures is merely illustrative. In general, display 10 may include any desired display structures (e.g., OLED structures, LED structures, etc.).

Figure 3:
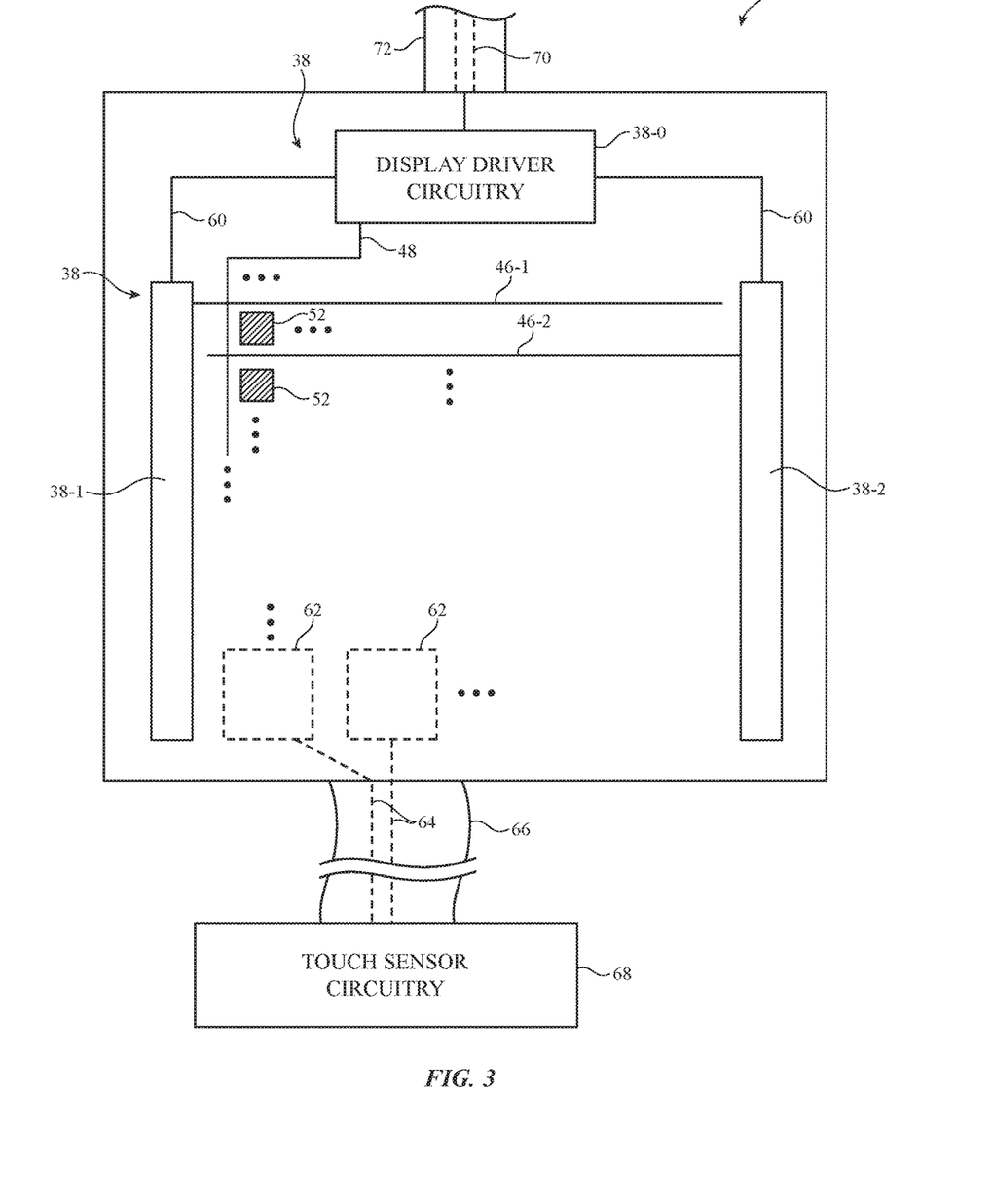
FIG. 3 is an illustrative diagram showing how a display may be provided with image pixel structures and touch sensor elements in accordance with an embodiment of the present invention.

A top view of an illustrative display is shown in FIG. 3. As shown in FIG. 3, display 10 may include an array of image pixels 52. Pixels 52 (which are sometimes referred to as subpixels) may each be formed from electrodes that give rise to an electric field and a portion of liquid crystal layer 16 (FIG. 2) that is controlled by that electric field. Each image pixel may have an electrode that receives a data line signal from an associated transistor and a common electrode. The common electrodes of display 10 may be formed from a layer of patterned indium tin oxide or other conductive planar structures. The patterned indium tin oxide structure or other conductive structures that are used in forming the common plane for image pixels 52 may also be used in forming capacitive touch sensor elements 62.

As illustrated by touch sensor elements 62 of FIG. 3, touch sensor elements (electrodes) may be coupled to touch sensor circuitry 68. Touch sensor elements 62 may include rectangular pads of conductive material, vertical and/or horizontal strips of conductive material, and other conductive structures. Signals from elements 62 may be routed to touch sensor processing circuitry 68 via traces 64 on flex circuit cable 66 or other suitable communications path lines.

In a typical arrangement, there are fewer capacitor electrodes 62 in display 10 than there are image pixels 52, due to the general desire to provide more image resolution than touch sensor resolution. For example, there may be hundreds or thousands of rows and/or columns of pixels 52 in display 10 and only tens or hundreds of rows and/or columns of capacitor electrodes 62.

Display 10 may include display driver circuitry 38. Display driver circuitry 38 may receive image data from processing circuitry in device 6 using conductive lines 70 in path 72. Path 72 may be, for example, a flex circuit cable or other communications path that couples display driver circuitry 38 to integrated circuits on a printed circuit board elsewhere in device 6 (as an example).

Display driver circuitry 38 may include control circuit 38-0, gate line driver circuit 38-1, and gate line driver circuit 38-2. Display driver control circuit 38-0 may be implemented using one or more integrated circuits (e.g., one or more display driver integrated circuits). Circuits 38-1 and 38-2 (sometimes referred to as gate line and Vcom driver circuitry) may be incorporated into control circuit 38-0 or may be implemented using thin-film transistors on layer 14 (FIG. 2). Gate line driver circuits 38-1 and 38-2 implemented using thin-film transistor structures on layer 14 may sometimes be referred to as gate driver on array or "GOA." Paths such as paths 60 may be used to interconnect display driver circuitry 38. Display driver circuitry 38 may also be implemented using external circuits or other combinations of circuitry, if desired.

Display driver circuitry 38 may control the operation of display 10 using a grid of signal lines such as data lines 48, gate lines 46, and Vcom lines (not shown). In the example of FIG. 3, gate driver circuit 38-1 may serve to provide gate line signals to display pixels 52 arranged along even rows in the array (e.g., by supplying gate line signals on even gate lines 46-1), whereas gate driver circuit 38-2 may serve to provide gate line signals to display pixels 52 arranged along odd rows in the array (e.g., by supplying gate line signals on odd gate lines 46-2). This type of interlaced driving scheme in which gate line driver circuits drive signals from two different sides of the array in this way is merely illustrative. In other suitable arrangements, gate drivers may be formed on only one side, or on more than two sides of the image pixel array.

Note that the touch function may be performed during a touch interval portion of the video frame, and in particular during a "blanking" interval (rather than during a display interval) of the video frame. In conventional displays, the touch interval is typically inserted only between successive display intervals that each display an entire image/video frame (i.e., conventional touch screen displays are only configured to implement inter-frame pause for touch sensing). This example is merely illustrative. If desired, touch sensor circuitry 68 and touch sensor electrodes 62 may be omitted (e.g., in scenarios where display 10 does not have touch screen functionality).

Figure 4:
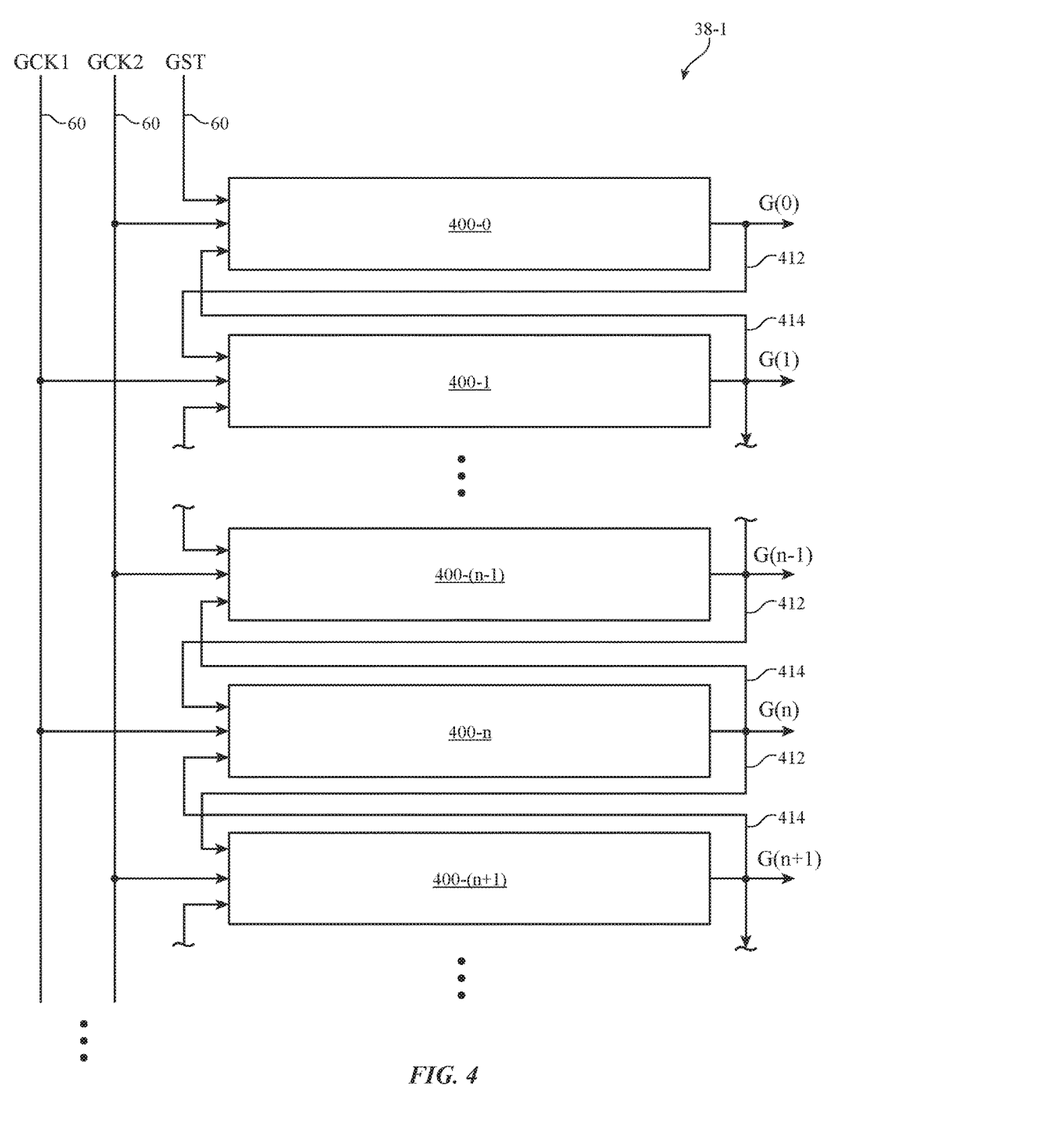
FIG. 4 is a circuit diagram of illustrative gate driver circuits arranged in a chain in accordance with an embodiment.

FIG. 4 is a circuit diagram of gate driver circuitry that can be used to support display functions. As shown in FIG. 4, gate driver circuitry 38-1 may include a chain of gate driver circuits 400 (e.g., a first driver circuit 400-1, a second driver circuit 400-2, an $(n-1)^{th}$ driver circuit 400-((n-1)) an $n^{th}$ driver circuit 400-$n$, an $(n+1)^{th}$ driver circuit 400-($n$+1), etc.). Driver circuits 400 may receive first clock signal GCK1 and second clock signal GCK2 from control circuitry 38-0 via control lines 60. Driver circuits 400 may additionally receive ground voltage signals VGL, power supply voltage signals VGH, and reset control signals RESET from control circuitry 38-0 via lines 60. Gate clock signals GCK1 and GCK2 may be provided to alternating circuits 400 (e.g., clock signals GCK2 may be provided to even numbered drivers 400 whereas clock signals GCK1 are provided to odd numbered drivers 400). Driver circuits 400 may each produce a corresponding gate line output signal G. Gate line signal G may be provided to a corresponding row of pixels 52 (FIG. 3). For example, driver circuit 400-0 may provide gate line signals G(0) to a first row of pixels 52, driver circuit 400-1 may provide gate line signals G(1) to a second row of pixels 52, driver circuit 400-$n$ may provide gate line signals G($n$) to an $n^{th}$ row of pixels 52, etc.

Gate driver output signals G may each be fed to an input of the successive gate driver 400 in the chain via feedforward signal path 412. For example, first driver 400-0 may provide output signal G(0) to an input of second driver 400-1 via path 412, ((n−1))$^{th}$ driver 400-((n−1)) may provide output signal G((n−1)) to an input of n$^{th}$ driver 400-n via path 412, driver 400-n may provide output signal G(n) to an input of driver 400-(n+1) via path 412, etc. Gate driver output signals G may each be fed to a previous gate driver 400 in the chain via feed-back signal path 414. For example second driver 400-1 may provide output signal G(1) to an input of first driver 400-0 via path 414, driver 400-n may provide output signal G(n) to an input of driver 400-((n−1)) via path 414, driver 400-(n+1) may provide output signal G(n+1) to an input of driver 400-n via path 414, etc.

First driver circuit 400-0 may receive a gate start pulse signal GST over lines 60 instead of a feed forward gate output signal (e.g., because driver 400-0 is the first driver in the chain). Start pulse signal GST may be asserted to begin percolating output signals G down chain 38-1. The example of FIG. 4 is merely illustrative. In scenarios where driver 38-1 is formed on a single side of the pixel array, output signals G(n) may be provided to every row of pixels 52. In scenarios where drivers 38-1 and 38-2 are formed on two sides of the pixel array, output signals G(n) may be provided by circuitry 38-1 to alternating rows of pixels in the array (e.g., odd numbered rows or even numbered rows). In general, feed-forward paths 414 may provide the output signals G to any desired succeeding driver circuit (e.g., driver circuits immediately succeeding a given driver circuit, two rows after the given driver circuit, three rows after the given driver circuit, etc.) and feed-back paths 412 may provide the output signals to any desired preceding driver circuit (e.g., driver circuits immediately preceding a given driver circuit, two rows before the given driver circuit, three rows before the given driver circuit, etc.). The circuit components within gate drivers 400 may all be formed using thin-film transistor structures if desired (e.g., within layer 14 of FIG. 2).

Figure 5:
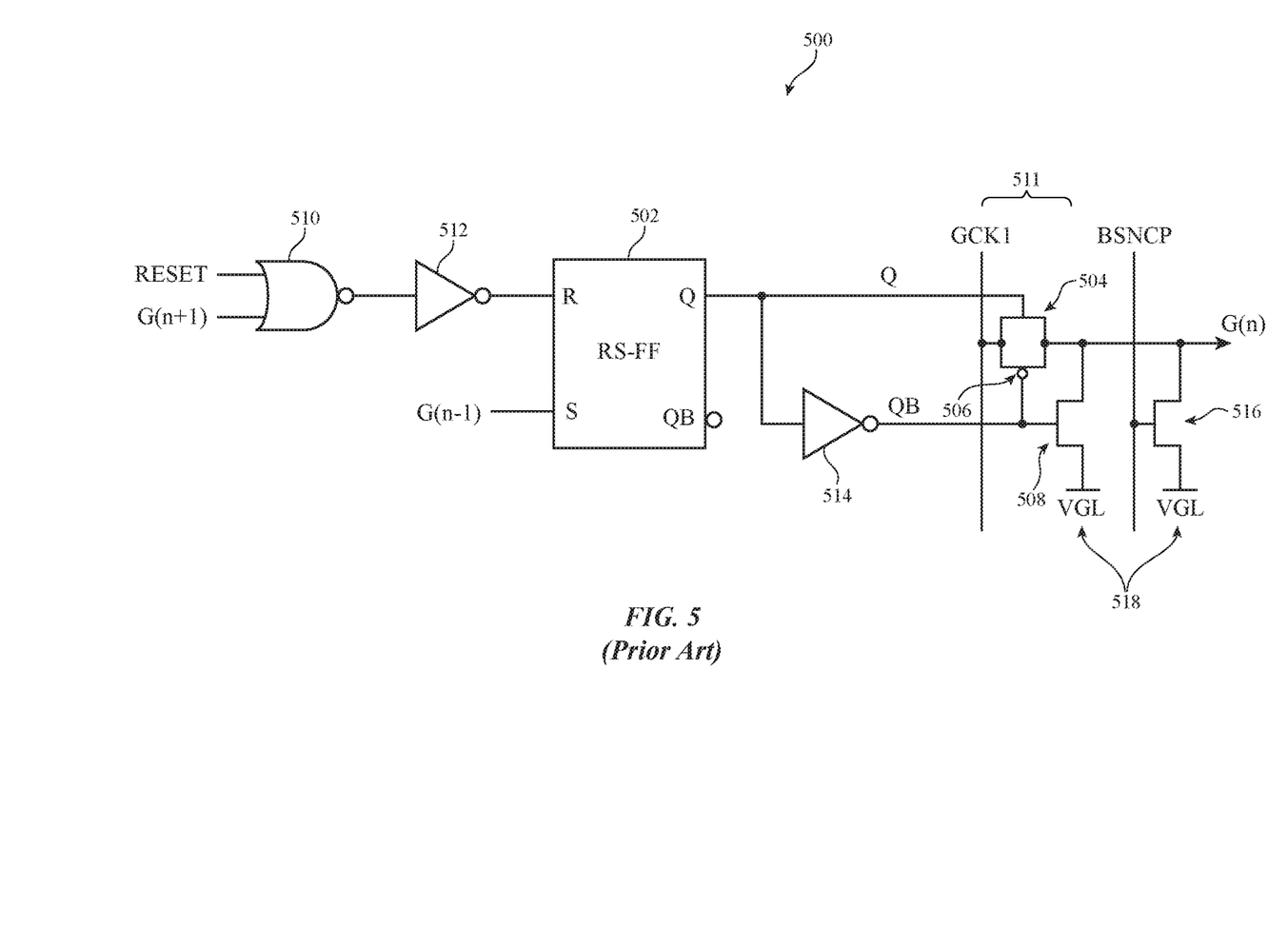
FIG. 5 is a circuit diagram of conventional gate driver circuit having digital logic.

FIG. 5 is a diagram of a conventional gate driver unit 500 (i.e., a conventional gate driver circuit formed in a chain of driver circuits that receives a clock signal and that receives gate outputs from previous and subsequent drivers in the chain). Conventional gate driver 500 generates output gate value G(n) for the n$^{th}$ row of pixels 52 in the array. Gate driver unit 500 receives gate output signal G(n+1) from the succeeding gate driver in the chain and receives gate output signal G((n−1)) from the preceding gate driver in the chain. Gate driver unit 500 receives reset signal RESET, clock signal GCK1, and control signal BSNCP from corresponding driver control circuitry.

Gate driver unit 500 includes a set-reset flip-flop (RS-FF) 502, an n-channel transistor 504, a p-channel transistor 506, a first pull down transistor 508, a second pull down transistor 516, a logic NOR gate 510, a flip-flop input inverter 512, and a flip-flop output inverter 514. The n-channel transistor 504 and the p-channel transistor 506 are connected in parallel and are sometimes referred to collectively as a "pass gate" or a transmission gate 511. The pass gate has a first terminal that receives clock signal GCK1 and a second terminal that is coupled to ground line 518 (i.e., a power supply line on which ground voltage VGL is provided). The second terminal also serves as the output of gate driver 500.

Logic NOR gate 510 has a first input that receives reset signal RESET and a second input that receives succeeding gate output signal G(n+1) from the next gate driver circuit in the chain. The output of logic NOR gate is connected to the input of inverter 512. The output of inverter 512 is connected to the reset input R of flip-flop 502. The set input S of flip-flop 502 receives preceding gate output signal G((n−1)) from the preceding gate driver circuit in the chain.

Flip-flop 502 has a data output on which output data Q is provided. Data output Q is provided to transmission gate 520 and to an input of inverter 514. The output of inverter 512 is connected to the gate terminal of p-channel transistor 506 in transmission gate 511. Logic NOR gate 510 behaves like an inverter when one of its inputs is at logic zero but is configured to drive its output low when one of its inputs is at logic one.

In some scenarios, it may be desirable to operate the gate driver circuits in an all-gate-high power down mode (sometimes referred to herein as a "gate-all-select" mode or "all-gate-high" mode). Operating the gate driver circuits in the gate-all-select mode can prevent undesired effects from propagating during a display power-down event. Undesired effects can include display flickering during power down, inability to display a truly black image, and interference with other device circuitry such as touch sensor circuitry that can be operated while the display is turned off. During an intentional power-down event or when powering down a display due to an unexpected power supply disruption, permanent damage to the display can be avoided by ensuring that each display pixel is discharged (i.e., that the charge stored on each pixel is discharged during the power-down event). By operating the driver circuits in a gate-all-select mode, all of the pixels in the display can be discharged to mitigate any such undesired effects during display power-down events.

In order to operate the display driver circuits in the gate-all-select (GAS) mode, control signals GST, GLK1, GLK2, and each of the gate driver output signals G need to be simultaneously asserted (pulsed high). As shown in FIG. 5, conventional display driver circuits 500 can attempt to operate in the GAS mode by simultaneously asserting signals GST, GLK1, GLK2, and driver output signals G (i.e., driver output signals G(n), G((n−1)), and G(n+1) are simultaneously asserted at a logic high level). Because output signal G(n+1) is asserted high, the output of NOR gate 510 is forced low (i.e., because the output of NOR gate 512 is low whenever at least one of its inputs is high). Inverter 512 inverts the output of NOR gate 512, forcing reset input R of flip-flop 502 to logic high. Similarly, flip-flop 502 receives output signal G((n−1)) at a logic high level at its set input S. In other words, while attempting to operate conventional driver circuit 500 in the GAS mode, the reset and set inputs of set-reset flip-flop 502 in driver circuit 500 are both forced to a logic high level. However, the output of set-reset flip-flops such as flip-flop 502 is undefined and is generally unstable when the set and reset inputs of the flip-flop are simultaneously provided at logic high levels. As such, the output of flip-flop 502 and the corresponding output signals G become unstable and incapable of properly discharging the pixels during power down of the display.

Figure 6:
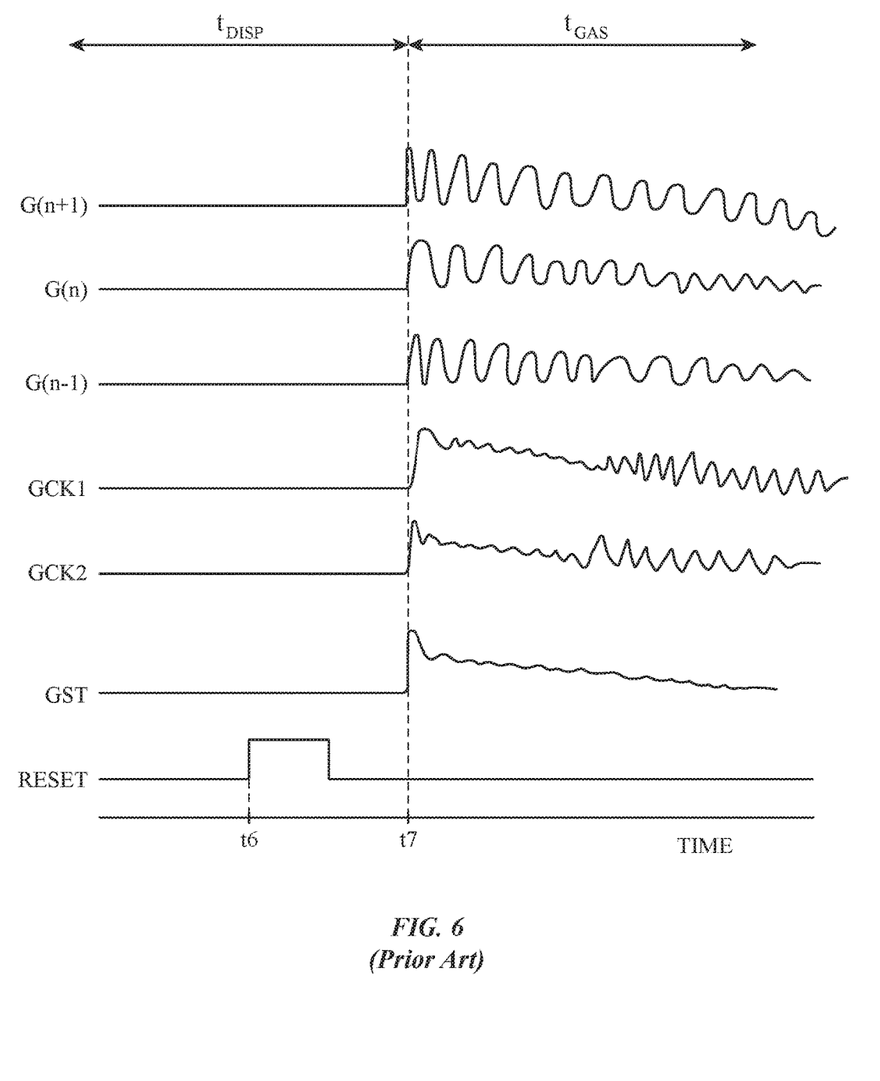
FIG. 6 is a timing diagram of relevant waveforms illustrating how conventional gate driver circuits are unstable when operated in a mode in which gate driver output signals are simultaneously asserted by each of the driver circuits in a chain.

FIG. 6 is a timing diagram showing relevant waveforms that illustrate the operation of conventional gate driver circuitry of the type shown in FIG. 5 when attempting to operate the conventional gate driver circuitry in the GAS mode. At time t6, reset signal RESET may be temporarily pulsed high during display period tDisp. When the display is to power down, the driver circuitry enters attempts to enter GAS mode and each of signals GST, GCK1, GCK2, and output signals G such as G(n−1), G(n), and G(n+1) are asserted high at time t7. However, such operation forces the set and reset inputs of the set-reset flip-flops 502 in the driver circuits to logic high levels such that each of the signals becomes unstable during the GAS time period $t_{GAS}$. This instability is illustrated by the waveforms shown in FIG. 6, which vary erratically over time during period tGAs and are generally unstable. As output signals G become unstable, the output signals are no longer suitable to completely discharge the pixels in the array. Conventional driver circuits 500 are therefore incapable of completely discharging the pixels during device power down events. It would therefore be desirable to be able to provide display gate driver circuitry with improved pixel discharging capabilities.

Figure 7:
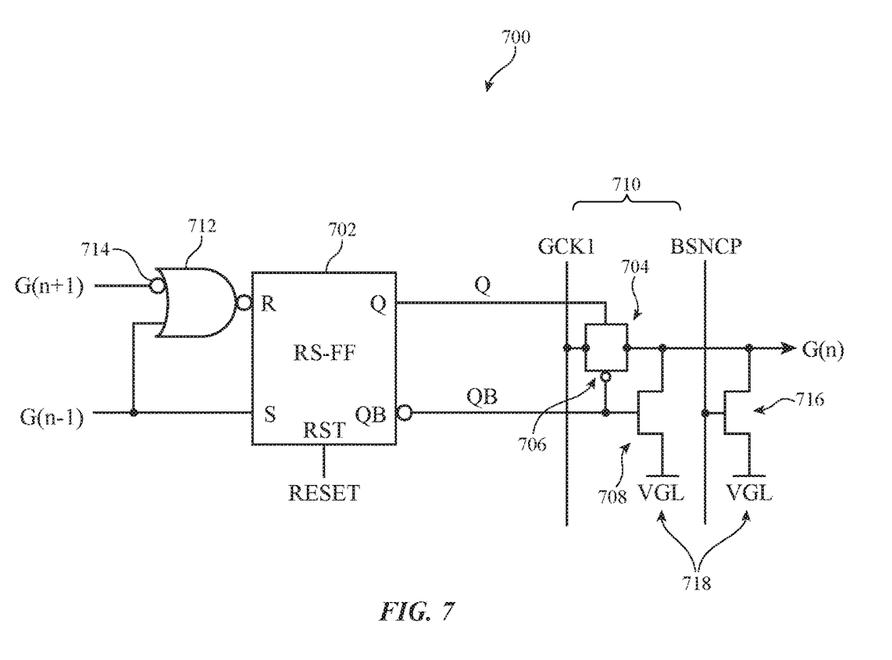
FIGS. 7 and 8 are circuit diagrams of an illustrative gate driver circuit operable in a mode in which gate driver output signals are simultaneously asserted by each of the driver circuits in a chain for effectively discharging display pixels in accordance with an embodiment.

FIG. 7 is a diagram of an illustrative gate driver circuit 700 having set-reset flip-flop circuits and gate-all-select capabilities in accordance with an embodiment. Gate driver circuit 700 may perform gate-all-select operations to effectively discharge pixels 52 during power down events. Gate driver circuit 700 may, for example, be implemented as a gate driver circuit 400 as shown in FIG. 4.

In the example of FIG. 7, gate driver unit 700 generates gate driver output signal G(n) to drive pixel gates in the $n^{th}$ row of the display pixel array. Gate driver unit 700 may receive gate output signal G(n+1) from the succeeding gate driver in the chain and gate output signal G(n−1) from the previous gate driver in the chain. The first gate driver in the chain may receive signal GST in place of signal G(n−1). Gate driver unit 700 may receive reset signal RESET, clock signal GCK1, high voltage signal VGH, ground voltage signal VGL, and control signal BSNCP from driver control circuitry 38-0 via control lines 60 (FIG. 3).

As shown in FIG. 7, gate driver 700 may include a RS-FF circuit 702 (sometimes referred to as a "set-reset latch" or an "RS latch"), a logic NOR gate 712, a transmission gate 710, pull down transistors 708 and 716, and an inverter 714. Transmission gate 710 may include an n-channel transistor 706 and a p-channel transistor 704 coupled in parallel to pass signals from one source-drain terminal to another. Transmission gate 710 may have a first terminal that receives clock signal GCK1 and a second terminal that is coupled to ground line 718 (e.g., a power supply line on which ground voltage VGL is provided). The gate terminal of n-channel transistor 704 may be coupled to a first output terminal of flip-flop 702 on which data output Q is provided. The gate terminal of p-channel transistor 706 may be coupled to a second output terminal of flip-flop 702 on which the inverse QB of data output Q is provided. The gate terminal of p-channel transistor 706 may additionally be coupled to the gate of pull down transistor 708. The second terminal of transmission gate 710 also serves as the output of gate driver 700. The circuit components within gate driver 700 may all be formed using thin-film transistor structures if desired.

Flip-flop circuit 702 may have a set input S that receives the gate line signal (e.g., G(n−1)) from the preceding gate driver in the chain and a reset input R that is coupled to an output of logic NOR gate 712. Flip-flop circuit 702 may have a dedicated reset control signal input terminal RST that receives reset signal RESET from control circuitry 38-0 (e.g., via paths 60). Input terminal RST may be a control signal input to flip-flop circuit 702 whereas reset input R is the reset input of the set-reset latch. Logic NOR gate 712 may have a first input that is coupled to an output of inverter 714 and a second input that receives the gate line signal (e.g., G(n−1)) from the preceding gate driver in the chain (e.g., via feed-forward path 412 of FIG. 4). The input of inverter 714 may receive the gate line signal (e.g., G(n+1)) from the succeeding gate driver in the chain (e.g., via feed-back path 414 of FIG. 4).

Figure 8:
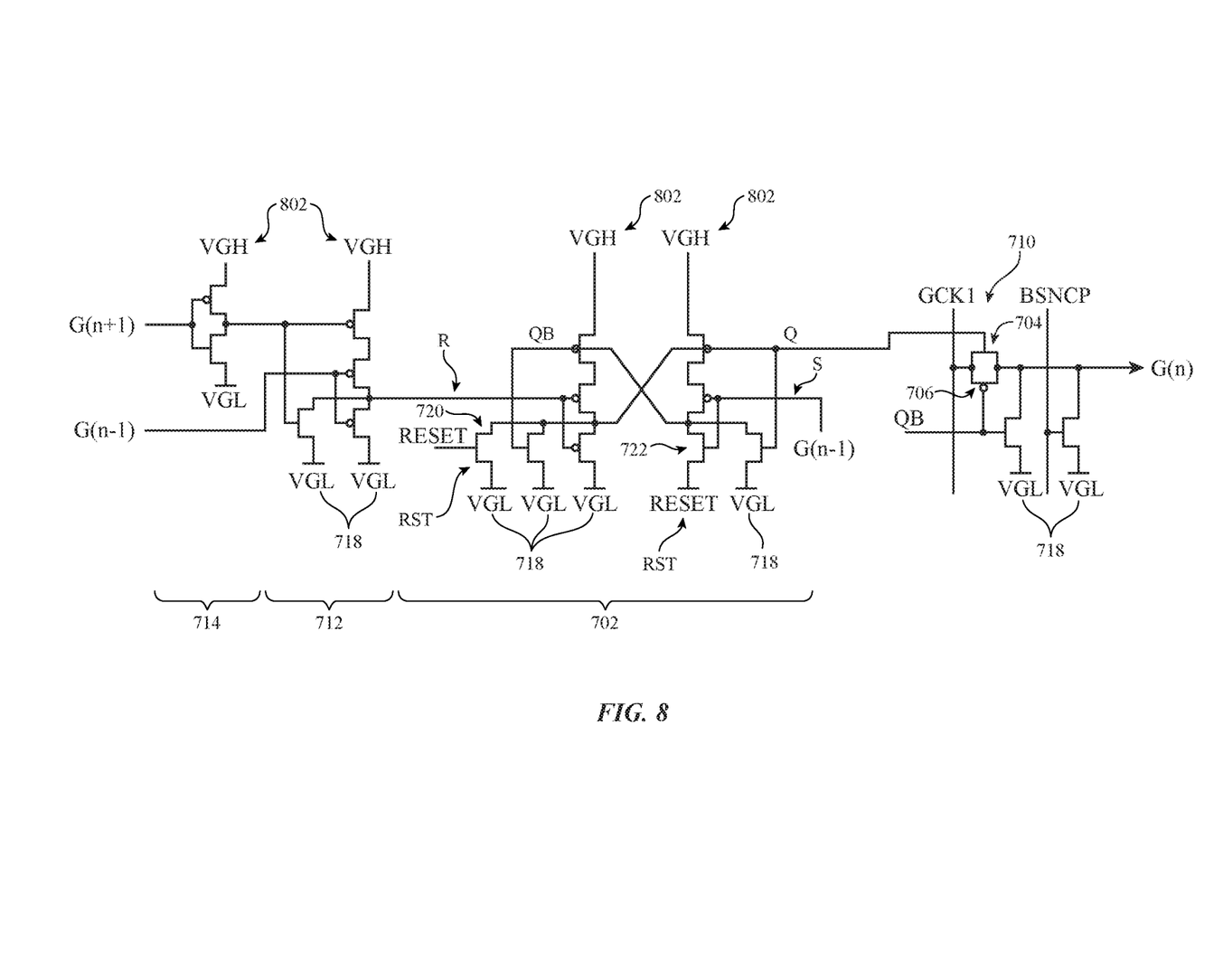

FIG. 8 shows a more detailed implementation of gate driver unit 700. The particular arrangement of components shown in FIG. 8 is merely illustrative and does not serve to limit the scope of the present invention. As shown in FIG. 8, inverter 714, NOR gate 712, and flip-flop 702 may each include a number of n-channel and/or p-channel transistors connected between ground terminals 718 (e.g., a power supply line on which ground voltage VGL is provided) and high voltage terminals 802 (e.g., a voltage line on which a power signal VGH such as power supply voltage signal or other voltage that is greater than ground voltage VGL is provided). For example, gate line signals G(n−1) may be provided to gate terminals of corresponding p-channel and n-channel transistors in NOR gate 712 (e.g., gate terminals that serve as an input to NOR gate 712) and to gate terminals of corresponding p-channel and n-channel transistors in RS-FF 702 (e.g., gate terminals that serve as set input S of RS-FF 702). Gate line signals G(n+1) may be provided to gate terminals of corresponding p-channel and n-channel transistors in inverter 714 (e.g., gate terminals that serve as an input to inverter 714). Flip-flop circuit 702 may provide data signals Q to the gate terminal of n-channel transistor 704 in transmission gate 710 and may provide inverted data signals QB to the gate of p-channel transistor 706 in transmission gate 710. Signal QB may be the complement of signal Q (e.g., signals Q and QB are inverted versions of one another).

Flip-flop circuit 702 may include a dedicated reset transistor 720. The gate of reset transistor 720 may serve as dedicated reset terminal RST that receives reset control signals RESET (e.g., as shown in FIG. 7). Reset transistor 720 may have a drain terminal coupled to the drain terminal of other n-channel transistors in flip-flop circuit 702 and to the gate terminal of at least one p-channel transistor in flip-flop circuit 702. Reset transistor 720 may have a source terminal coupled to ground voltage VGL. If desired, dedicated reset terminal RST of flip-flop circuit 702 may include a drain terminal of transistor 722 in flip-flop 702 (e.g., the drain terminal of transistor 722 may receive reset signals RESET). When reset signal RESET is asserted at logic "1," transistor 720 turns on, pulling data output Q to low voltage VGL (e.g., asserting output Q at low logic level "0"). If data output QB is not yet at logic "0" (i.e., the inverse of data output Q), reset voltage RESET provided to the drain terminal of transistor 722 may force data output QB to logic "0." Reset signal RESET may be asserted to force data output Q to logic "0," effectively initializing or resetting the gate driver circuit. By forming reset terminal RST within latch 702, driver circuit 702 may effectively prioritize reset control signals RESET over the set and reset inputs of circuit 702 (e.g., so that control signals RESET may override the other inputs of circuit 702).

Figure 9:
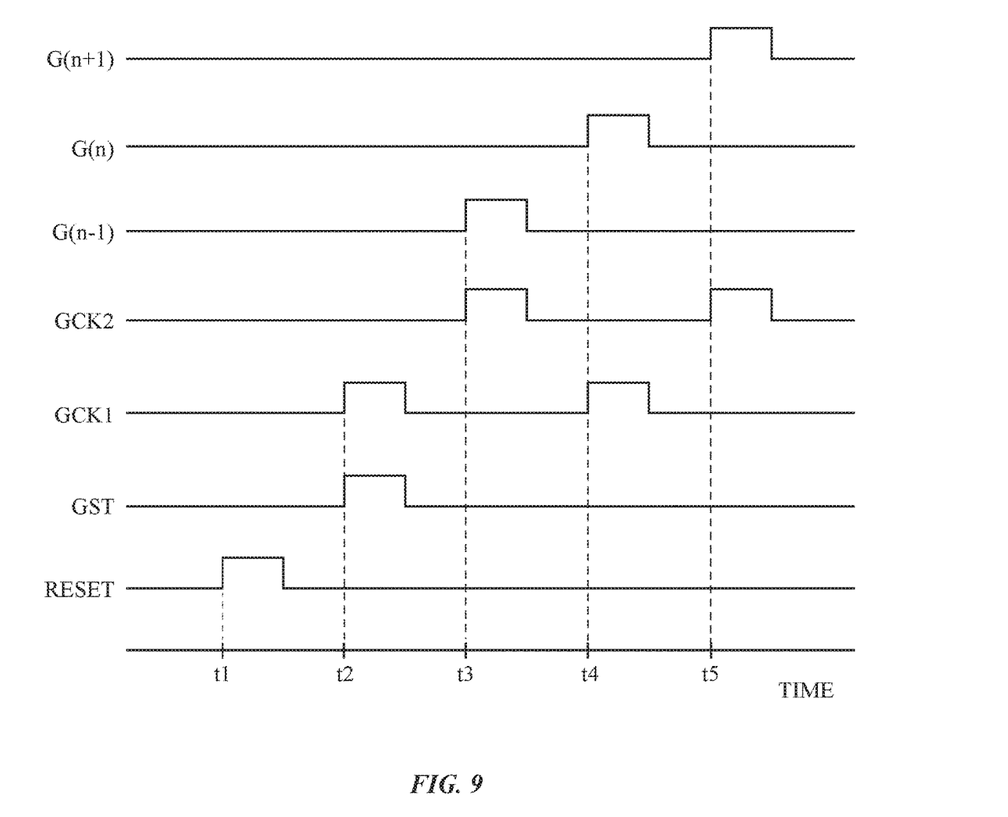
FIG. 9 is an illustrative timing diagram of relevant waveforms that illustrate the operation of a gate driver of the type shown in FIGS. 7 and 8 in accordance with an embodiment.

FIG. 9 is a timing diagram that illustrates the operation of gate driver unit 700 as shown in FIGS. 7 and 8. At time t1, initialization signal RESET may be pulsed high to reset driver circuitry 500 (e.g., to force data output Q to logic low). At time t2, start signal GST is pulsed high to the first driver circuit in the chain to begin percolating driver output signals down the driver chain (FIG. 4). At time t2, GCK1 may also be temporarily pulsed high. At time t3, signal GCK2 may be pulsed high to assert gate driver output signal G(n−1) of the gate driver preceding gate driver 700. At this time, a high voltage signal may be latched by the succeeding gate driver unit (e.g., driver 700) to assert data signal Q. At time t4, GCK1 may be pulsed high to assert gate driver output G(n). Signal G(n) may be pulsed high since transmission gate 710 has already been activated by the asserted signals Q and QB. At time t5, GCK2 may be pulsed high to assert gate driver output G(n+1) of the succeeding gate driver. In general, the operations from time t3 to t5 can be iterated to shift the gate pulses sequentially through the entire gate driver chain to successively generate gate line signals G across the entire display.

Gate driver unit 700 may be operated in a GAS mode in which signals GCK1, GCK2, GST, and output signals G are all simultaneously asserted. Simultaneously asserting these signals will ensure that each of the pixels in the array is fully discharged to mitigate any undesired power-down effects such as display flickering.

When clock signal GCK1 is asserted, G(n) may be output at a logic high level. Succeeding output signal G(n+1) and preceding output signal G(n−1) may be received at a logic high level from the succeeding and preceding drivers respectively. For example, the second input of NOR gate 712 may receive signal G((n−1)) at logic high and set input S of latch 702 may receive signal G(n−1) at logic high, whereas the first input of NOR gate 712 may receive signal G(n+1) at logic high. Inverter 715 may invert logic high signal G(n+1) to output a logic low signal that is provided to the first input of NOR gate 712. NOR gate 712 outputs a logic low level when at least one of its inputs is at logic high. NOR gate 712 will therefore output a logic low level in response to receiving signals G(n+1) and G(n−1) at driver 700 at logic high levels as is the case when operating in the GAS mode. The reset terminal of latch 702 will thereby be forced to logic low. In other words, when operating in the GAS mode, the reset and set inputs of latch 702 will never both be at logic high, so the output of latch 702 will be well defined and stable. For example, latch 702 will set data output Q to a stable high logic level "1," which is provided as output value G(n) (e.g., because clock signal GCK1 is asserted high in the GAS mode so that data signal Q is passed to the output of driver 700). Latch 702 may thereby be operated in both a normal driving mode (e.g., a display mode to display images on display 52) and in GAS mode (e.g., during display power down) without the set and reset inputs of latch 702 both being asserted at the same time. This may result in the display gate drivers outputting stable driver output signals G in the GAS mode so that pixels 52 are effectively discharged during power off of the display (e.g., without inducing flicker or other undesirable effects).

Figure 10:
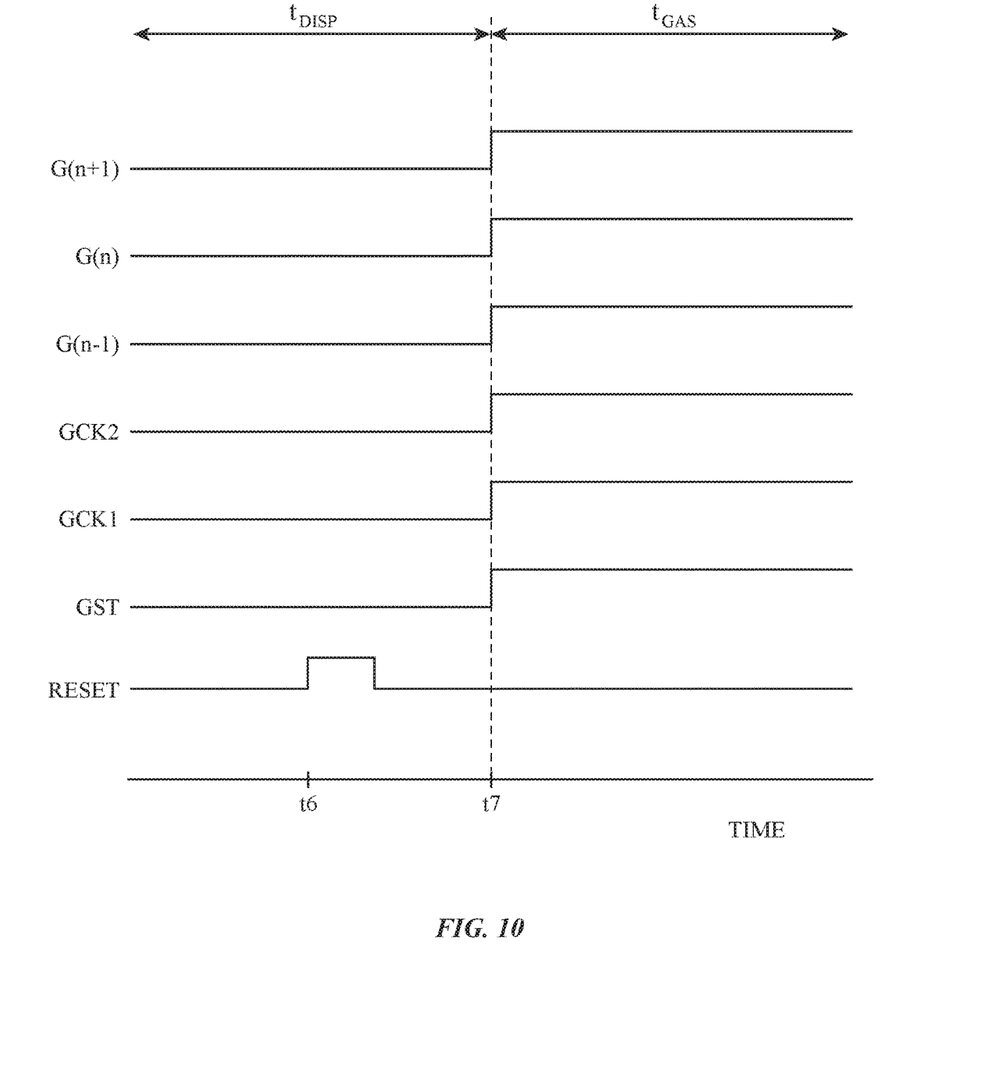
FIG. 10 is an illustrative timing diagram of relevant waveforms that illustrate how gate a driver of the type shown in FIGS. 7 and 8 can be operated in a mode in which gate driver output signals are simultaneously asserted by each of the driver circuits in a chain without becoming unstable in accordance with an embodiment.

FIG. 10 is a timing diagram showing relevant waveforms that illustrate the operation of gate driver circuitry of the type shown in FIGS. 7 and 8 when operating in the GAS mode. At time t6, reset signal RESET may be temporarily pulsed high during display period tDisp (e.g., to force data output Q to a logic low level). When the display is to power down, the driver circuitry enters GAS mode and each of signals GST, GCK1, GCK2, and output signals G such as G((n−1)), G(n), and G(n+1) are asserted at a logic high level at time t7. As latch 702 does not receive logic high signals at both its reset and set inputs (despite each of the output signals G being driven high), each of signals GST, GCK1, GCK2, and G will be stable during GAS mode time period tGAs (e.g., without excessive variation in the signal over time or other instabilities in the signal). Output signals G may thereby effectively discharge the corresponding pixels 52 during display power down without generating undesirable effects such as display flickering.

The example of FIGS. 7 and 8 is merely illustrative. If desired, clock signal GCK1 may be provided to gate terminals of transistors 704 and/or 706 instead of to the source/drain terminals of the transistors. However, in general, providing clock signal GCK1 to the source/drain terminals of the transistors as shown in FIGS. 6 and 7 may involve a reduced gate capacitance and reduced overall power consumption relative to when clock signal GCK1 is provided to the gate terminals.

If desired, driver circuits 700 may be operated in a so-called slew rate control mode in which driver controller 38-0 performs slew rate control operations on drivers 700. Controller 38-0 may perform slew rate control operations by adjusting the resistance of an output buffer in controller 38-0 to adjust clock signals GCK1 and GCK2 provided to gate drivers 700 in real time. Clock signals GCK1 and GCK2 may be adjusted to tweak the speed (slope) of the rising and falling edges of gate signals G.

Figure 11:
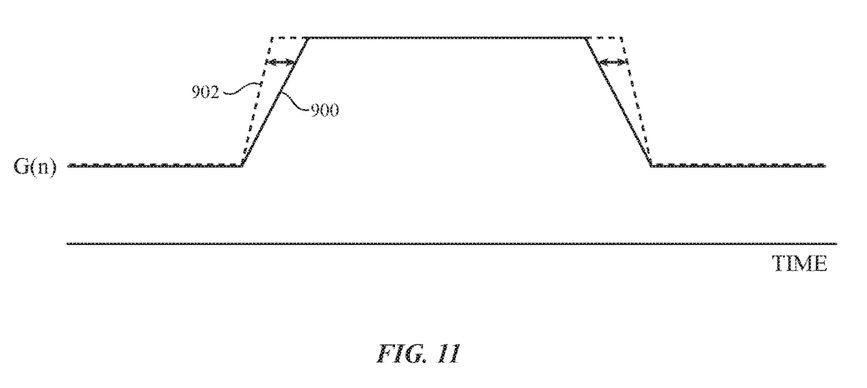
FIG. 11 is an illustrative timing diagram showing how gate driver control circuitry may adjust the slew rate of gate driver output signals in accordance with an embodiment.

FIG. 11 is an illustrative waveform diagram showing how controller 38-0 may perform slew rate control to adjust the rising and falling edges of signal G(n). As shown in FIG. 11 Controller 38-0 may adjust clock signals GCK1 and GCK2 to adjust the rising and falling edges to have a desired slope. For example, controller 38-0 may control drivers 700 to provide output signals G(n) having a first rising and falling edge slope as shown by curve 900 or having a second rising and falling edge slope as shown by curve 902. In this way, controller 38-0 may fine tune the gate driver output signals generated by circuits 700.

The foregoing is merely illustrative of the principles of this invention and various modifications can be made by those skilled in the art without departing from the scope and spirit of the invention. The foregoing embodiments may be implemented individually or in any combination.

What is claimed is:

1. Display circuitry, comprising:
   a display pixel array; and
   gate driver circuitry that is coupled to the display pixel array and that is operable to display images using the display pixel array, wherein the gate driver circuitry includes a plurality of gate drivers, and wherein a given gate driver in the plurality of gate drivers comprises:
   a set-reset latching circuit that generates a latch output signal and that has a set input and a reset input;
   a logic NOR gate having an output coupled to the reset input, a first input that is coupled to a first output of a preceding gate driver in the plurality of gate drivers, and a second input that is coupled to a second output of a succeeding gate driver in the plurality of gate drivers.

2. The display circuitry defined in claim 1, wherein the first input of the logic NOR gate receives a first gate driver output signal from the first output of the preceding gate driver and the given gate driver receives a second gate driver output signal from the second output of the succeeding gate driver.

3. The display circuitry defined in claim 2, further comprising:
   a pass transistor that passes a clock signal to an output terminal of the given gate driver based at least partly on the latch output signal.

4. The display circuitry defined in claim 3, wherein the clock signal passed by the pass transistor forms a third gate driver output signal that drives display pixels in a given row of the display pixel array.

5. The display circuitry defined in claim 3, wherein the pass transistor comprises an n-channel transistor and a p-channel transistor coupled together in parallel.

6. The display circuitry defined in claim 2, wherein the set input of the set-reset latching circuit receives the first gate driver output signal from the first output of the preceding gate driver.

7. The display circuitry defined in claim 2, wherein the set-reset latching circuit comprises a control terminal that receives a reset control signal that resets the given gate driver.

8. The display circuitry defined in claim 7, wherein the set-reset latching circuit further comprises:
a reset transistor having a gate terminal that receives the reset control signal.

9. The display circuitry defined in claim 8, wherein the reset transistor has a drain terminal that is coupled to a ground voltage line and a source terminal that is coupled to an additional drain terminal of an n-channel transistor in the set-reset latching circuit.

10. The display circuitry defined in claim 8, wherein the set-reset latching circuit further comprises:
an additional transistor having a drain terminal that receives the reset control signal.

11. The display circuitry defined in claim 2, further comprising:
an inverter having an inverter output coupled to the second input of the logic NOR gate and an inverter input that receives the second gate driver output signal from the second output of the succeeding gate driver.

12. The display circuitry defined in claim 2, wherein the gate driver circuitry further comprises:
gate driver control circuitry, wherein the gate driver control circuitry is configured to operate the plurality of gate drivers in a gate-all-select mode while the display is in a power down mode by simultaneously asserting first and second clock signals and a gate start pulse signal provided to the plurality of gate drivers.

13. The display circuitry defined in claim 12, wherein the gate driver control circuitry is further configured to perform slew rate control operations on the gate driver circuitry that adjusts rising and falling edges of a third gate driver signal output by the given gate driver by adjusting a clocking signal provided to the given gate driver.

14. The display circuitry defined in claim 2, wherein the gate driver circuitry is operable in a gate-all-select mode in which the first gate driver output signal and the second gate driver output signals are simultaneously asserted at a logic high level.

15. Display gate driver circuitry, comprising:
a plurality of gate drivers connected in a chain, wherein a given gate driver in the plurality of gate drivers comprises:
a set-reset latch circuit having an output, a set input, and a reset input;
a first output terminal;
a pass gate that is coupled between the output of the set-reset latch circuit and the first output terminal;
a logical gating circuit, wherein the logical gating circuit has an input that is coupled to a second output terminal of a preceding gate driver in the chain, and wherein the logical gating circuit has an output that is directly connected to the reset input of the set-reset latch circuit; and
an inverter circuit having an inverter output that is coupled to an additional input of the logical gating circuit and an inverter input that is coupled to a third output terminal of a succeeding gate driver in the chain.

16. The display gate driver circuitry defined in claim 15, wherein the set input of the set-reset latch is coupled to the second output terminal of the preceding gate driver in the chain.

17. The display gate driver circuitry defined in claim 16, wherein the pass gate is configured to pass a gate driver output signal to the first output terminal to control gate terminals on display pixels in a corresponding row of an array of display pixels.

18. The display gate driver circuitry defined in claim 16, wherein the logical gating circuit comprises a logic NOR gate.

19. An electronic device, comprising:
a display pixel array; and
first, second, and third gate driver circuits connected in a chain and configured to drive pixels on the display pixel array, wherein the first gate driver circuit has a first output terminal, the second gate driver circuit has a second output terminal, and the third gate driver circuit has a third output terminal, wherein the second gate driver comprises:
set-reset flip-flop circuitry having a set input, a reset input, and an output, wherein the output of the set-reset flip-flop circuitry is coupled to the second output terminal by a transmission gate;
an inverter circuit having an inverter input coupled to the third output terminal and having an inverter output; and
a logic NOR gate having an output that is directly connected to the reset input, a first input that is coupled to the inverter output, and a second input that is coupled to the first output terminal.

20. The electronic device defined in claim 19, wherein the first output terminal is coupled to a first row of display pixels in the display pixel array, the second output terminal is coupled to a second row of display pixels in the display array, and the third output terminal is coupled to a third row of display pixels in the display array.

21. The electronic device defined in claim 20, wherein the set-reset flip-flop circuitry comprises:
a reset transistor having a reset gate terminal that receives a reset control signal.

* * * * *